United States Patent
Hayakawa et al.

(10) Patent No.: US 7,180,137 B2
(45) Date of Patent: Feb. 20, 2007

(54) SEMICONDUCTOR DEVICE

(75) Inventors: Yasushi Hayakawa, Hyogo (JP); Katsushi Asahina, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/834,098

(22) Filed: Apr. 29, 2004

(65) Prior Publication Data
US 2005/0001237 A1    Jan. 6, 2005

(30) Foreign Application Priority Data
May 16, 2003    (JP)    ............... 2003-138900

(51) Int. Cl.
*H01L 23/62*    (2006.01)
(52) U.S. Cl. ..................... 257/350; 257/274
(58) Field of Classification Search ................ 257/274, 257/350
See application file for complete search history.

(56) References Cited

U.S. PATENT DOCUMENTS 5,479,115 A    12/1995    Ueda et al.

6,566,204 B1 *  5/2003  Wang et al. ................ 438/286

FOREIGN PATENT DOCUMENTS

JP    11-3895    1/1999

* cited by examiner

*Primary Examiner*—Long Pham
(74) *Attorney, Agent, or Firm*—McDermott Will & Emery LLP

(57) ABSTRACT

A terminating resistance element of an LSI chip has an $N^-$ type impurity diffusion region formed at the surface of a P type well at the surface of a semiconductor substrate, an $N^+$ type impurity diffusion layer formed at the surface of the $N^-$ type impurity diffusion region, and a pair of electrodes formed at respective ends at the surface of the $N^+$ type impurity diffusion layer. The $N^-$ type impurity diffusion region has an impurity concentration lower than the impurity concentration of the $N^+$ type impurity diffusion layer. Therefore, the capacitance of the PN junction becomes smaller as compared to the conventional case where the N type impurity diffusion layer is provided directly at the surface of a P type semiconductor substrate. Therefore, reflection and attenuation of an input signal are suppressed.

1 Claim, 9 Drawing Sheets

US 7,180,137 B2

SEMICONDUCTOR DEVICE

BACKGROUND OF THE INVENTION

1. Field of the Invention

The present invention relates to semiconductor devices, particularly, a semiconductor device including a terminating resistance element preventing an input signal from being reflected.

2. Description of the Background Art

LSI chip are conventionally provided with a terminating resistance element to prevent an input signal from being reflected. This terminating resistance element has, on the surface of a semiconductor substrate of the first conductivity type (for example, P type), an impurity diffusion layer of the second conductivity type (in this case, N type) differing from that of the semiconductor substrate, and a pair of electrodes formed at respective ends at the surface of the impurity diffusion layer (refer to Japanese Patent Laying-Open No. 11-3895, for example).

If a conventional terminating resistance element is provided at a high-speed LSI chip to which a high speed signal of at least 500 MHz is input, there was a problem that the input signal is attenuated to cause erroneous operation of the LSI chip due to the large capacitance of the PN junction between the above-described semiconductor substrate and impurity diffusion layer.

SUMMARY OF THE INVENTION

In view of the foregoing, a main object of the present invention is to provide a semiconductor device that can prevent an input signal from being reflected and attenuated.

A semiconductor device according to the present invention includes an input terminal receiving an input signal, and a terminating resistance element preventing an input signal from being reflected. The terminating resistance element includes a semiconductor substrate of a first conductivity type, a first impurity diffusion region of a second conductivity type formed at the surface of the semiconductor substrate, the second conductivity type being different from the first conductivity type, an impurity diffusion region of the second conductivity type formed at the surface of the first impurity diffusion region, and having an impurity concentration higher than that of the first impurity diffusion region, and a pair of electrodes provided apart from each other at the surface of the impurity diffusion layer, one electrode connected to the input terminal, and the other electrode connected to a first power supply line. Since a first impurity diffusion region of low impurity concentration is provided between the impurity diffusion layer and the semiconductor substrate, the capacitance of the PN junction can be reduced. Thus, reflection and attenuation of an input signal can be prevented.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
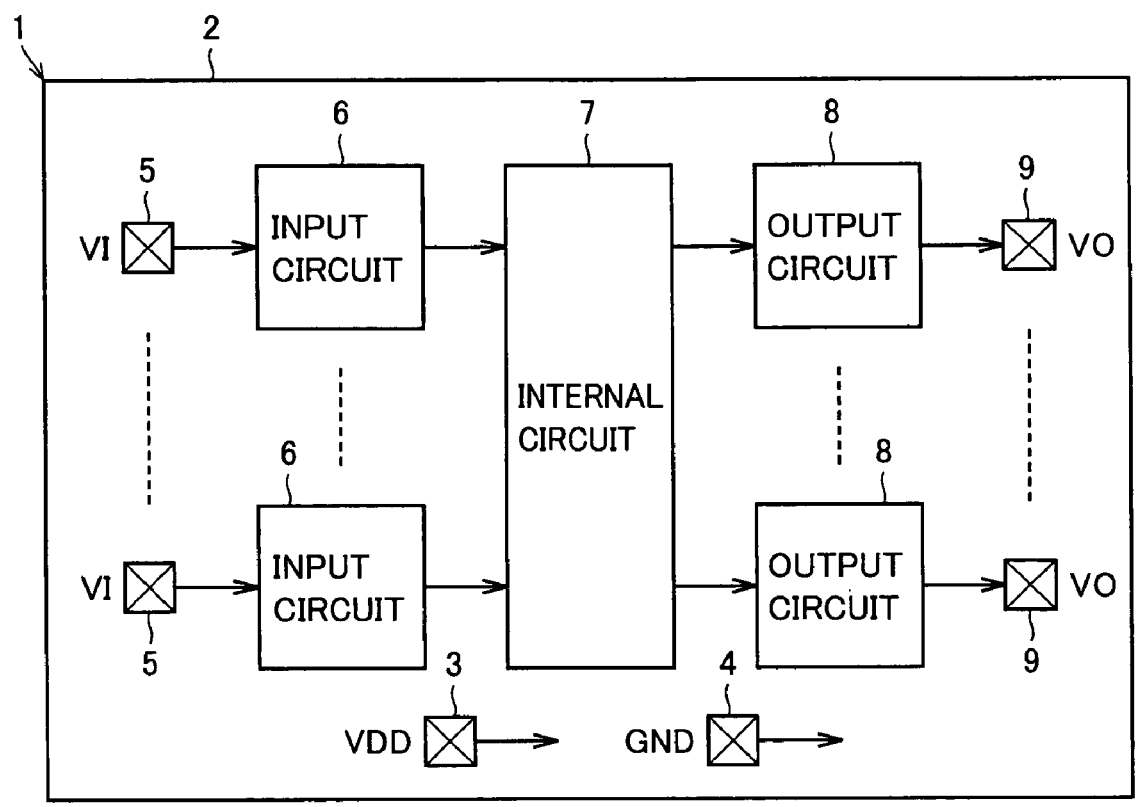
FIG. 1 is a block diagram of an entire configuration of an LSI chip according to a first embodiment of the present invention.

FIG. 1 is a block diagram of a configuration of an LSI chip 1 according to a first embodiment of the present invention. Referring to FIG. 1, LSI chip 1 is a high-speed LSI chip to which signals VI and VO of at least 500 MHz are input and output, and includes a semiconductor substrate 2, and power supply pads 3 and 4, a plurality of input pads 5, a plurality of input circuits 6, an internal circuit 7, a plurality of output circuits 8 and a plurality of output pads 9 formed at the surface of semiconductor substrate 2.

Power supply pad 3 is connected to each of input circuits 6, internal circuit 7, and each of output circuits 8, via a line of power supply potential VDD (not shown), and receives an externally applied power supply potential VDD. Power supply pad 4 is connected to each of input circuits 6, internal circuit 7, and each of output circuits 8 via a line of ground potential GND (not shown), and receives externally applied power supply potential GND. Each of input circuits 6, internal circuit 7 and each of output circuits 8 are driven by power supply potential VDD and ground potential GND.

Input circuit 6 transmits signal VI applied via input pad 5 from an external source to internal circuit 7. Internal circuit 7 carries out a predetermined operation based on a plurality of signals applied from plurality of input circuits 6 to generate and provide to plurality of output circuits 8 a plurality of signals, respectively. Output circuit 8 responds to a signal applied from internal circuit 7 to generate signal VO, which is output to an external source via output pad 9.

Figure 2:
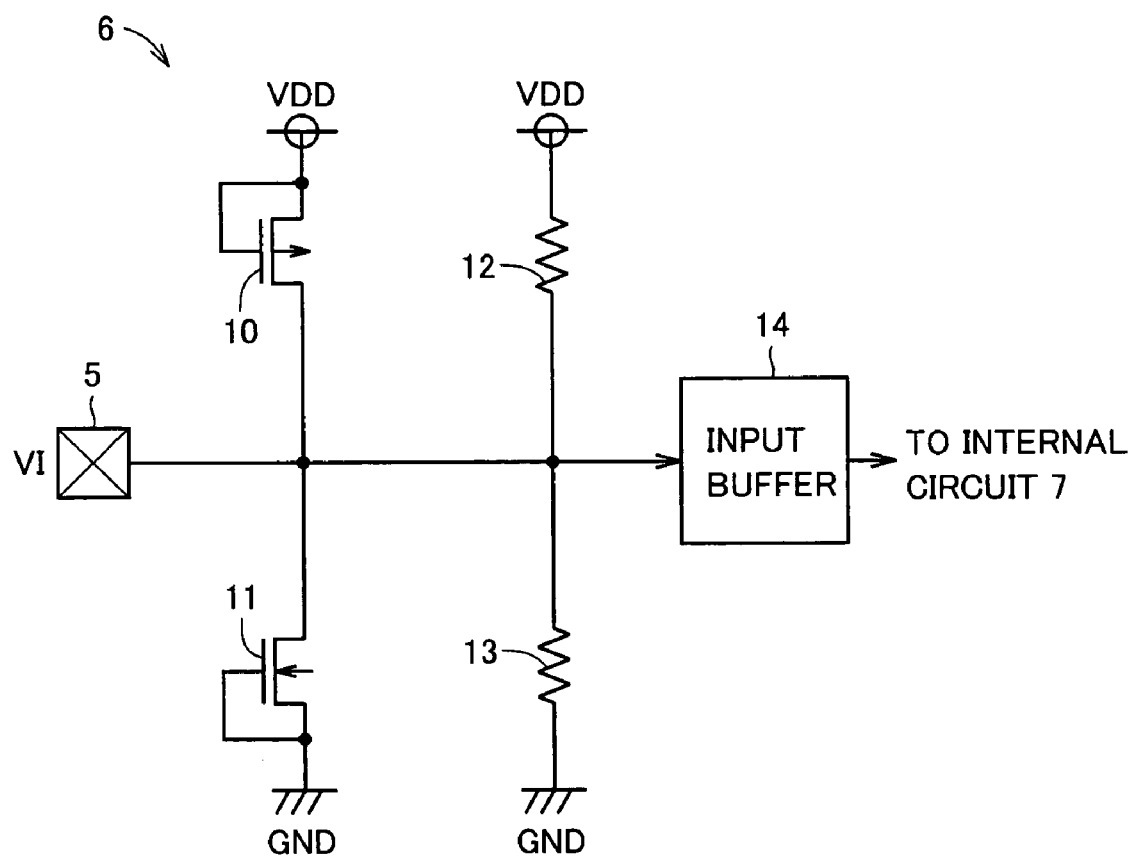
FIG. 2 is a circuit block diagram of a configuration of an input circuit of FIG. 1.

FIG. 2 is a circuit block diagram of a configuration of input circuit 6. Referring to FIG. 2, input circuit 6 includes a P channel MOS transistor 10, an N channel MOS transistor 11, terminating resistance elements 12 and 13, and an input buffer 14. P channel MOS transistor 10 is connected between the line of power supply potential VDD and input pad 5, and has its gate connected to the line of power supply potential VDD. N channel MOS transistor 11 is connected between input pad 5 and the line of ground potential GND, and has its gate connected to the line of ground potential GND. MOS transistors 10 and 11 constitute an input protection circuit.

P channel MOS transistor 10 conducts in response to the flow of positive-going surge current to input pad 5, whereby the surge current is absorbed at the line of power supply potential VDD. N channel MOS transistor 11 conducts in response to the flow of negative-going surge current to input pad 5, whereby the surge current is absorbed at the line of ground potential GND. Thus, input buffer 14 and the like are prevented from being damaged by the surge current.

Terminating resistance element 12 is connected between the line of power supply potential VDD and input pad 5, whereas terminating resistance element 13 is connected between input pad 5 and the line of ground potential GND. Terminating resistance elements 12 and 13 have a resistance value equal to the characteristic impedance of the signal transmission line for input signal VI (for example 50Ω), and effects impedance matching between the signal transmission line and input buffer 14 to prevent input signal VI from being reflected. Accordingly, degradation of the waveform of signal VI caused by reflection of signal VI is prevented. Thus, erroneous operation of the LSI chip is suppressed. Input buffer 14 transmits to internal circuit 7 signal VI applied from an external source via input pad 5.

Figure 3A:
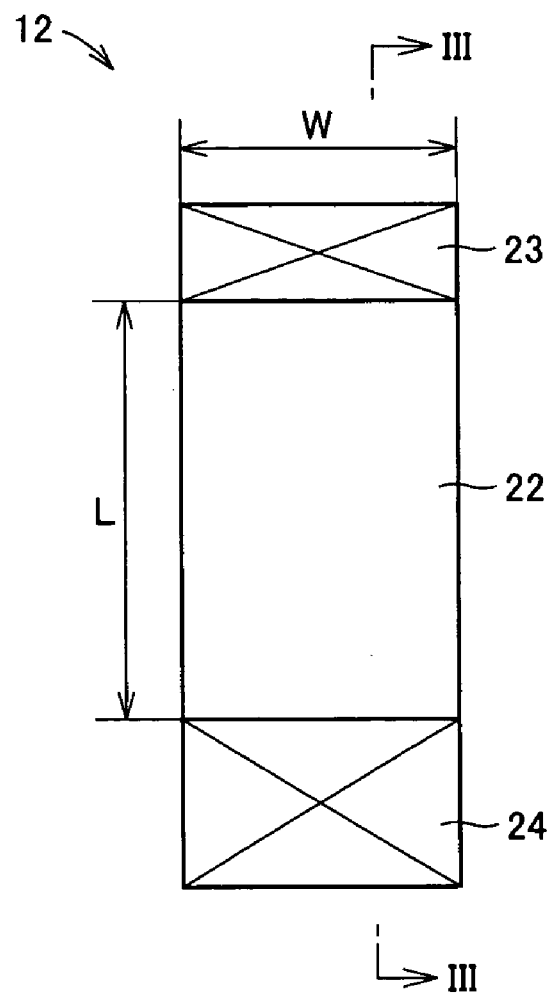
FIGS. 3A and 3B show configurations of a terminating resistance element of FIG. 2.

FIG. 3A is a plan view of a configuration of terminating resistance element 12, and FIG. 13B is a sectional view taken along line III—III of FIG. 3A.

Figure 3B:
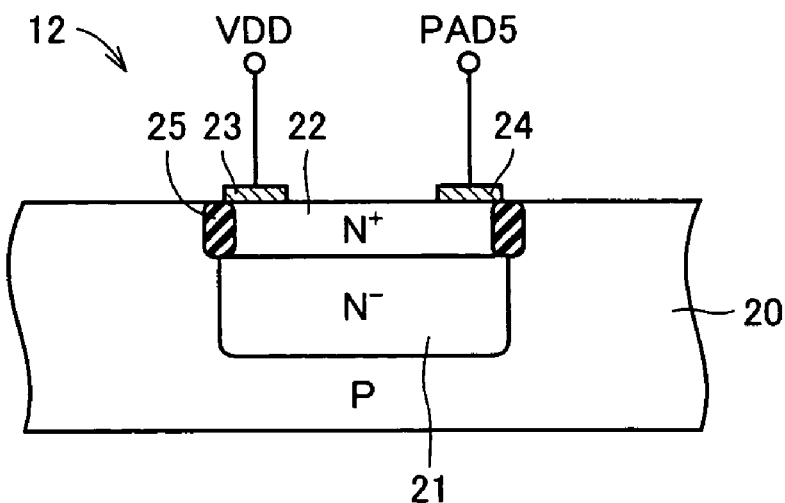

Referring to FIGS. 3A and 3B, terminating resistance element 12 has an $N^-$ type impurity diffusion region 21 formed on the surface of a P type well 20 at the surface of a semiconductor substrate (crystalline silicon substrate) 2, an $N^+$ type impurity diffusion layer 22 formed at the surface of $N^-$ type impurity diffusion region 21, a pair of electrodes 23 and 24 formed at respective ends at the surface of $N^-$ type impurity diffusion layer 22, and a field oxide film ($SiO_2$ film) 25 around $N^+$ type impurity diffusion layer 22.

$N^-$ type impurity diffusion region 21 is of a conductivity type (N type) identical to that of $N^+$ type impurity diffusion layer 22. The impurity concentration of $N^-$ type impurity diffusion region 21 is lower than the impurity concentration of $N^+$ type impurity diffusion layer 22. The $N^+$ type impurity diffusion layer and P type well 20 are separated by field oxide film 25. Electrodes 23 and 24 are formed of silicide to reduce the contact resistance with $N^+$ type impurity diffusion layer 22 and form an ohmic contact.

Electrode 23 is connected to the line of power supply potential VDD, whereas electrode 24 is connected to input pad 5. P type well 20 receives ground potential GND. Therefore, reverse bias voltage is applied respectively at the junction between $N^+$ type impurity diffusion layer 22 and $N^-$ type impurity diffusion region 21, and the junction between the $N^-$ type impurity diffusion region and P type well 20 to inhibit current flow. The resistance value of terminating resistance element 12 mainly depends on the width W of electrodes 23 and 24, the distance L between electrodes 23 and 24, and the conductivity of $N^+$ type impurity diffusion layer 22. Terminating resistance element 13 has a configuration similar to that of terminating resistance element 12.

Since $N^-$ type impurity diffusion region 21 is provided between $N^+$ type impurity diffusion layer 22 and P type well 20 in the first embodiment, the capacitance of the PN junction is smaller as compared to the conventional case where the N type impurity diffusion layer is directly formed at the surface of a P type semiconductor substrate. Therefore, the problem of input signal VI being attenuated by the PN junction capacitance to cause erroneous operation of the LSI chip can be prevented.

Figure 4A:
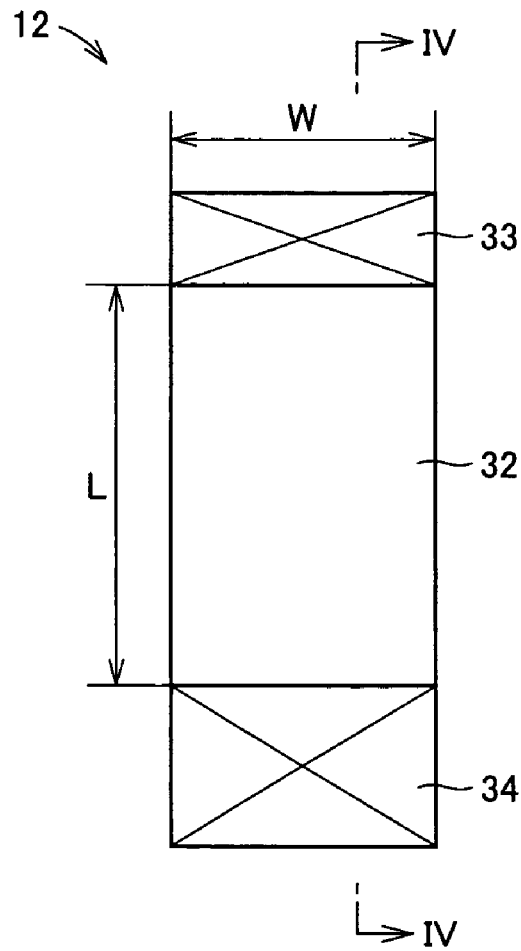
FIGS. 4A and 4B show a modification of the first embodiment.
Figure 4B:
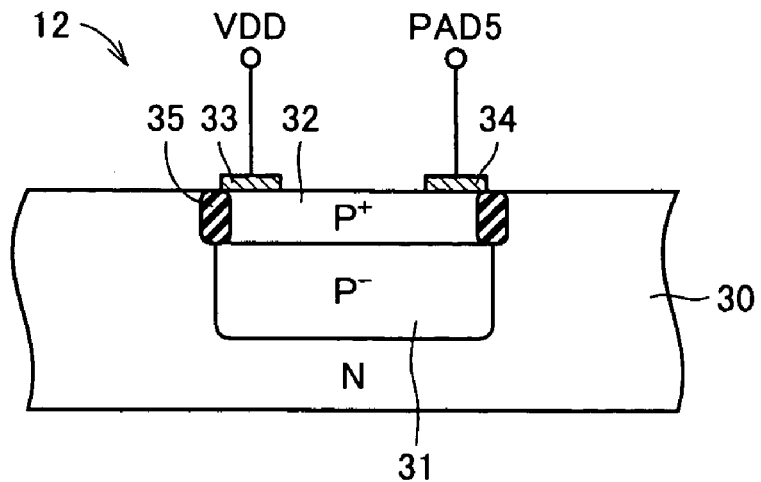

FIG. 4A is a plan view of a modification of the first embodiment, and FIG. 4B is a sectional view taken along line IV—IV of FIG. 4A.

Referring to FIGS. 4A and 4B, terminating resistance element 12 has a $P^-$ type impurity diffusion region 31 formed at the surface of an N type well 30 at the surface of semiconductor substrate (crystalline silicon substrate) 2, a $P^+$ type impurity diffusion layer 32 formed at the surface of a $P^-$ type impurity diffusion region 31, a pair of electrodes 33 and 34 formed at respective ends at the surface of $P^+$ type impurity diffusion layer 32, and a field oxide film ($SiO_2$ film) 35 around $P^+$ type impurity diffusion layer 32.

$P^-$ type impurity diffusion region 31 is of a conductivity type (P type) identical to that of $P^+$ type impurity diffusion layer 32. The impurity concentration of $P^-$ type impurity diffusion region 31 is lower than the impurity concentration of $P^+$ type impurity diffusion layer 32. $P^+$ type impurity diffusion layer 32 and N type well 30 are separated by field oxide film 35. Electrodes 33 and 34 are formed of silicide to reduce the contact resistance with $P^+$ type impurity diffusion layer 32 to form an ohmic contact.

Electrode 33 is connected to the line of power supply potential VDD, whereas electrode 34 is connected to input pad 5. N type well 30 receives power supply potential VDD. Therefore, reverse bias voltage is applied respectively to the junction between $P^+$ type impurity diffusion layer 32 and $P^-$ type impurity diffusion region 31, and the junction between $P^-$ type impurity diffusion region 31 and N type well 30, inhibiting current flow. The resistance value of terminating resistance element 12 depends mainly on the width W of electrodes 33 and 34, the distance L between electrodes 33 and 34, and the conductivity of $P^+$ type impurity diffusion layer 32.

Since a $P^-$ type impurity diffusion region 31 is provided between $P^+$ type impurity diffusion layer 32 and N type well 30 in the present modification, the capacitance of the PN junction becomes smaller as compared to the conventional case where a P type impurity diffusion layer is directly provided at the surface of the N type semiconductor substrate. Therefore, the problem of input signal VI being attenuated by the PN junction capacitance to cause erroneous operation of the LSI chip can be prevented.

[Second Embodiment]

Figure 5:
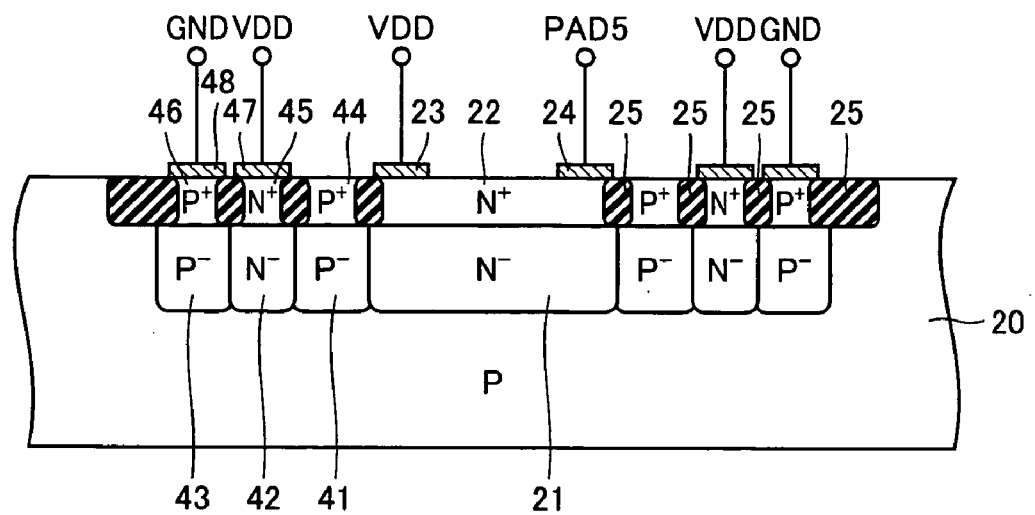
FIG. 5 is a sectional view of a configuration of a terminating resistance element of the LSI chip according to a second embodiment of the present invention.

FIG. 5 is a sectional view of a configuration of a terminating resistance element of an LSI chip according to a second embodiment of the present invention, comparable to FIG. 3B.

Referring to FIG. 5, the terminating resistance element has a $P^-$ type impurity diffusion region 41 formed around $N^-$ type impurity diffusion region 21, an $N^-$ type impurity diffusion region 42 formed around $P^-$ type impurity diffusion region 41, and a $P^-$ type impurity diffusion region 43 formed around $N^-$ type impurity diffusion region 42.

A $P^+$ type impurity diffusion layer 44, an $N^+$ type impurity diffusion layer 45, and a $P^+$ type impurity diffusion layer 46 are formed at the surface of $P^-$ type impurity diffusion region 41, $N^-$ type impurity diffusion region 42, and $P^-$ type impurity diffusion region 43, respectively. $P^+$ type impurity diffusion layer 44 is separated from $N^+$ type impurity diffusion layer 45, $N^+$ type impurity diffusion layer 45 from $P^+$ type impurity diffusion layer 46, and $P^+$ type impurity diffusion layer 46 from P type well 20 by field oxide film 25. On the surface of $N^+$ type diffusion layer 45 and $P^+$ type impurity diffusion layer 45 are provided electrodes 47 and 48, respectively, to which power supply potential VDD and ground GND are applied, respectively. Since ground potential GND is applied to P type well 20, each PN junction attains a reverse biased state.

The positive-going surge current flowing to input pad 5 is absorbed at the line of power supply potential VDD via $N^+$ type impurity diffusion layer 22, $N^-$ type impurity diffusion region 21, $P^-$ type impurity diffusion region 41, $N^-$ type impurity diffusion region 42, $N^+$ type impurity diffusion layer 45 and electrode 47. Therefore, the problem of surge current flowing into input buffer 14 to damage input buffer 14 can be prevented. The remaining configuration and operation are similar to those of terminating resistance element 12 shown in FIGS. 3A and 3B. Therefore, description thereof will not be repeated.

Figure 6:
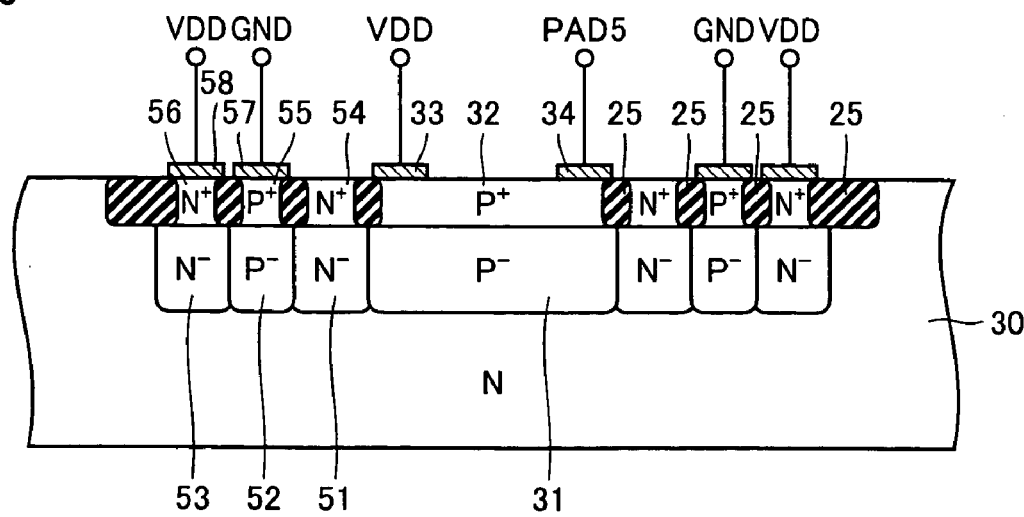
FIG. 6 is a sectional view showing a modification of the second embodiment.

FIG. 6 is a sectional view of a modification of the present second embodiment, comparable to FIG. 4B.

Referring to FIG. 6, the terminating resistance element has an N⁻ type impurity diffusion region 51 formed around P⁻ type impurity diffusion region 31, a P⁻ type impurity diffusion region 52 formed around N⁻ type impurity diffusion region 51, and an N⁻ type impurity diffusion region 53 formed around P⁻ type impurity diffusion region 52.

N⁺ type impurity diffusion layer 54, P⁺ type impurity diffusion layer 55 and N⁺ type impurity diffusion layer 56 are formed at the surface of N⁻ type impurity diffusion region 51, P⁻ type impurity diffusion region 52 and N⁻ type impurity diffusion region 53, respectively. N⁺ type impurity diffusion layer 54 is separated from P⁺ type impurity diffusion layer 55, P⁺ type impurity diffusion layer 55 from N⁺ type impurity diffusion layer 56, and N⁺ type impurity diffusion layer 56 from N type well 30 by field oxide film 25. On the surface of P⁺ type impurity diffusion layer 55 and N⁺ type impurity diffusion layer 56 are formed electrodes 57 and 58, respectively, to which ground potential GND and power supply potential VDD are applied, respectively. Since power supply potential VDD is applied to N type well 30, each PN junction attains a reverse bias status.

The negative-going surge current flowing into input pad 5 is absorbed by the line of ground potential GND via P⁺ type impurity diffusion layer 32, P⁻ type impurity diffusion region 31, N⁻ type impurity diffusion region 51, P⁻ type impurity diffusion region 52, P⁺ type impurity diffusion layer 55, and electrode 57. Therefore, the problem of surge current flowing into input buffer 14 to damage input buffer 14 can be prevented. The remaining structure and operation are similar to those of terminating resistance element 12 of FIGS. 4A and 4B. Therefore, description thereof will not be repeated.

[Third Embodiment]

Figure 7:
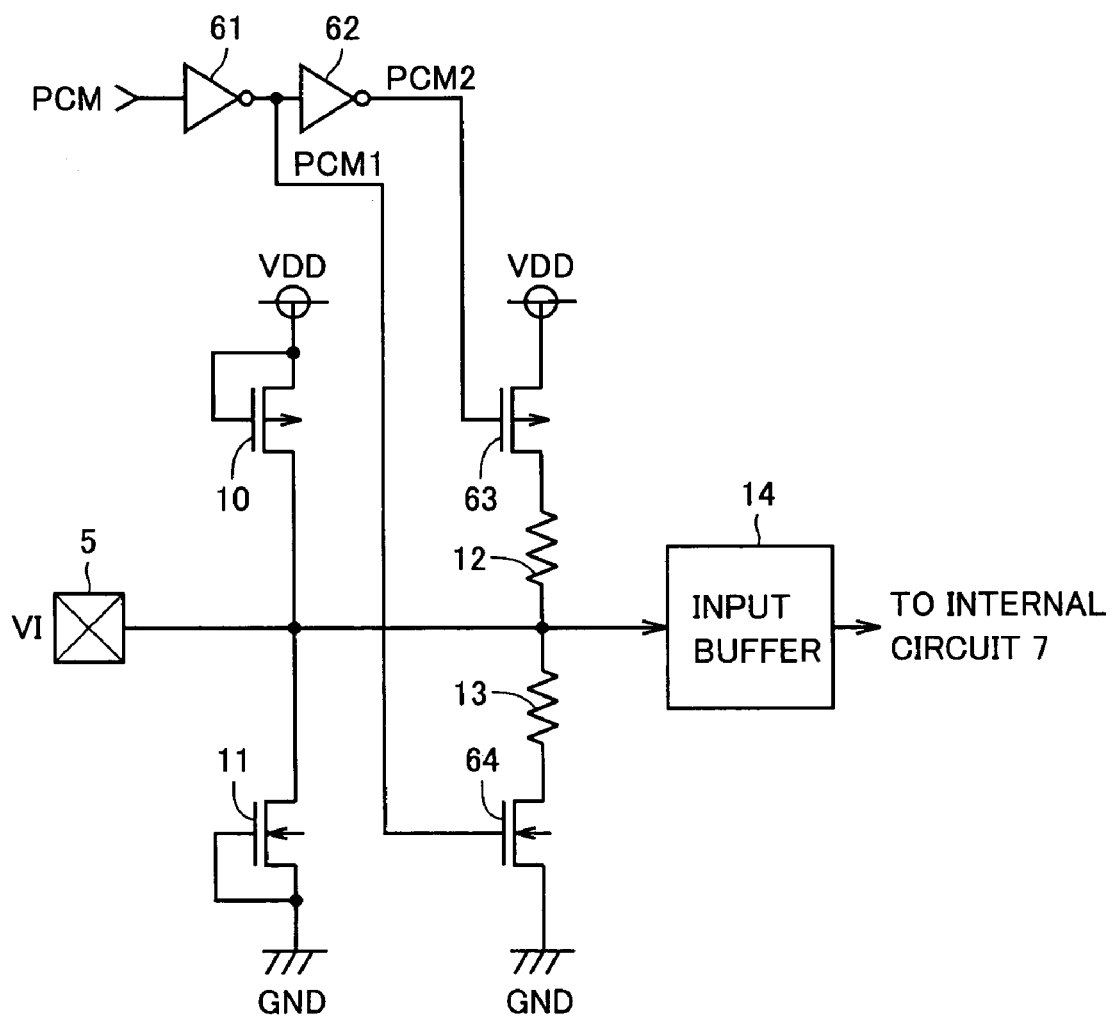
FIG. 7 is a circuit block diagram of a configuration of an input circuit of an LSI chip according to a third embodiment of the present invention.

FIG. 7 is a circuit block diagram of a configuration of an input circuit of an LSI chip according to a third embodiment of the present invention, comparable to FIG. 2.

Referring to FIG. 7, the input circuit differs from the input circuit of FIG. 2 in that a signal PCM is introduced, and inverters 61 and 62, a P channel MOS transistor 63, and an N channel MOS transistor 64 are additionally provided. Inverter 61 inverts signal PCM to generate a signal PCM1. Inverter 62 inverts signal PCM1 to generate a signal PCM2. P channel MOS transistor 63 is connected between the line of power supply potential VDD and one electrode of terminating resistance element 12, and receives signal PCM2 at its gate. N channel MOS transistor 64 is connected between one electrode of terminating resistance element 64 and the line of ground potential GND, and receives signal PCM1 at its gate.

When the LSI chip receives signal VI, signal PCM is pulled down to an L level to render MOS transistors 63 and 64 conductive. One electrode of terminating resistance element 12 is connected to the line of power supply potential VDD via P channel MOS transistor 63, and one electrode of terminating resistance element 13 is connected to the line of ground potential GND via N channel MOS transistor 64. Accordingly, impedance matching is effected between the signal transmission line for signal VI and input buffer 14 to prevent degradation of the waveform of signal VI.

When the LSI chip does not receive signal VI, signal PCM is pulled up to an H level to render MOS transistors 63 and 64 non-conductive. The current flowing to terminating resistance elements 12 and 13 is cut off so as to reduce power consumption.

Figure 8:
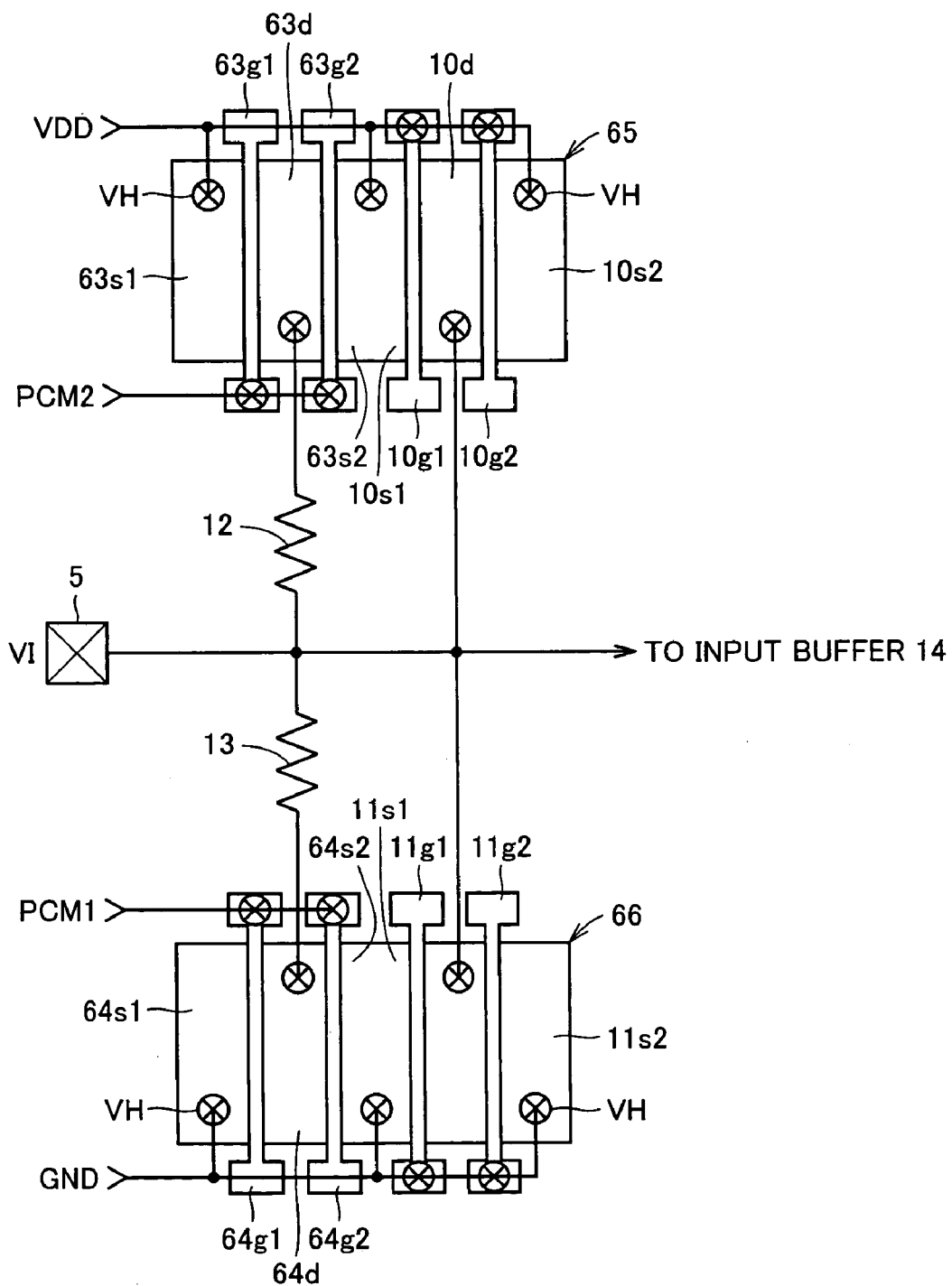
FIG. 8 shows a layout of an MOS transistor of FIG. 7.

FIG. 8 shows the layout of MOS transistors 10, 11, 63 and 64. Referring to FIG. 8, gate electrodes 63g1 and 63g2 of P channel MOS transistor 63 and gate electrodes 10g1, 10g2 of P channel MOS transistor 10 are arranged in parallel at the surface of the N type well with a gate oxide film therebetween. A rectangular P type impurity diffusion layer 65 is formed so as to cover the four gate electrodes 63g1, 63g2, 10g1 and 10g2.

P type impurity diffusion layer 65 is divided into a first source region 63s1 of P channel MOS transistor 63, a drain region 63d of P channel MOS transistor 63; a region serving as a second source region 63s2 of P channel MOS transistor 63 and a first source region 10s1 of P channel MOS transistor 10, a drain region 10d of P channel MOS transistor 10, and a second source region 10s2 of P channel MOS transistor 10 by four gate electrodes 63g1, 63g2, 10g1 and 10g2.

Each of regions 63s1, 63s2, (10s1), 10s2 and gate electrodes 10g1, 10g2 receive power supply potential VDD via a via hole VH. Each of gate electrodes 63g1 and 63g2 receives a signal VCM2 via via hole VH. Drain region 63d is connected to one electrode of terminating resistance element 12 via via hole VH. Drain region 10d is connected to input pad 5 via via hole VH.

Gate electrodes 64g1 and 64g2 of N channel MOS transistor 64 and gate electrodes 11g1 and 11g2 of N channel MOS transistor 11 are arranged in parallel at the surface of the P type well with a gate oxide film therebetween. A rectangular N type impurity diffusion layer 66 is formed so as to cover the four gate electrodes 64g1, 64g2, 11g1 and 11g2.

N type impurity diffusion layer 66 is divided into a first source region 64s1 of N channel MOS transistor 64, a drain region 64d of N channel MOS transistor 64, a region serving as a second source region 64s2 of N channel MOS transistor 64 and a first source region 11s1 of N channel MOS transistor 11, a drain region 11d of N channel MOS transistor 11, and a second source region 11s2 of N channel MOS transistor 11.

Each of regions 64s1, 64s2, (11s1), 11s2 and gate electrodes 11g1, 11g2 receives ground potential GND via via hole VH. Each of gate electrodes 64g1 and 64g2 receives signal VCM1 via via hole VH. Drain region 64d is connected to one electrode of terminating resistance element 13 via via hole VH. Drain region 11d is connected to input pad 5 via via hole VH.

Figure 9:
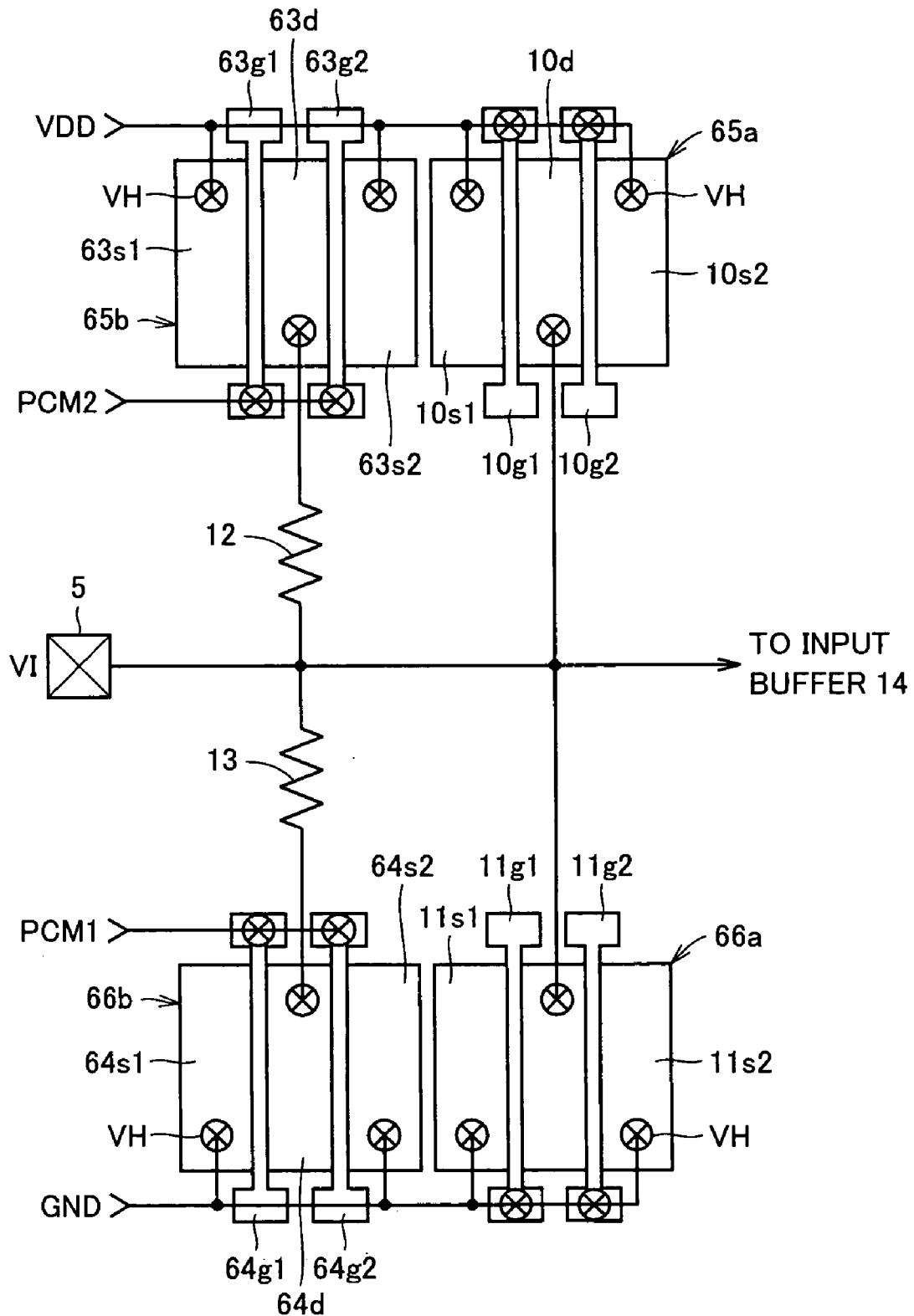
FIG. 9 is a diagram to describe an advantage of the third embodiment.

In accordance with such a layout, the layout area can be reduced since the P type impurity diffusion region between gate electrodes 63g2 and 10g1 doubles as source region 63s2 of P channel MOS transistor 63 and source region 10s1 of P channel MOS transistor 10, whereas the N type impurity diffusion region between gate electrodes 64g2 and 11g1 doubles as source region 64s2 of N channel MOS transistor 64 and source region 11s1 of N channel MOS transistor 11. In contrast, in the case where P channel MOS transistors 63 and 10 are formed separately and N channel MOS transistors 64 and 11 are formed separately as shown in FIG. 9, the layout area is larger than in FIG. 8.

Figure 10:
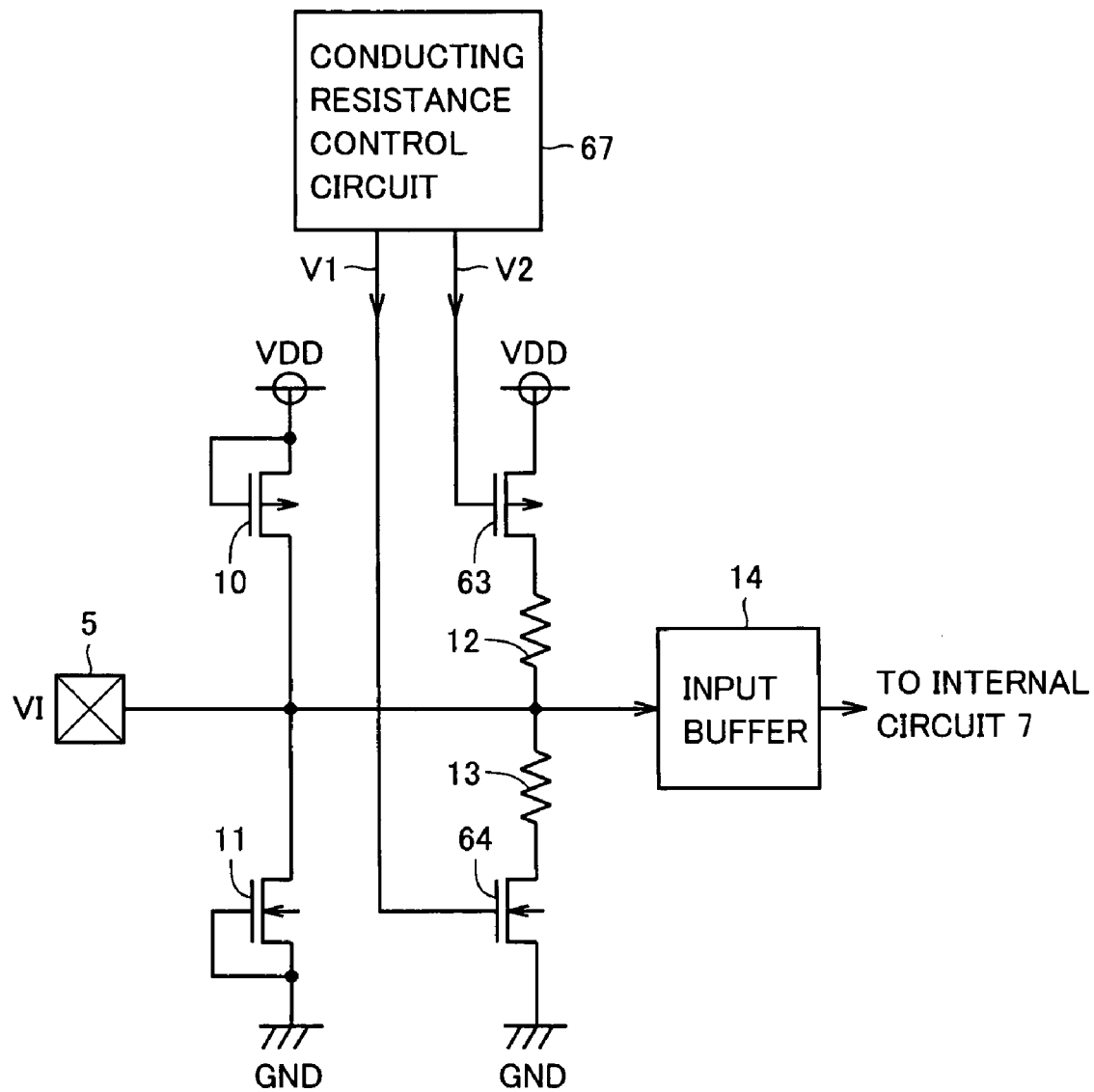
FIG. 10 is a circuit block diagram of a modification of the third embodiment.

FIG. 10 is a circuit block diagram of a modification of the third embodiment, comparable to FIG. 7. Referring to FIG. 10, the input circuit differs from the input circuit of FIG. 7 in that inverters 61 and 62 are replaced with a conducting resistance control circuit 67. Conducting resistance control circuit 67 applies control potentials V1 and V2 to the gates of MOS transistors 64 and 63, respectively. The conducting resistance value of MOS transistors 64 and 63 varies in accordance with control potentials V1 and V2. Therefore, the terminating resistance value can be adjusted to a desired value in accordance with the characteristic impedance of the signal transmission line for signal VI in the present modification. Thus, reflection of signal VI can be prevented more effectively.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   an input terminal receiving an input signal, and
   a terminating resistance element preventing said input signal from being reflected,
   wherein said terminating resistance element comprises
   a semiconductor substrate of a first conductivity type,
   a first impurity diffusion region of a second conductivity type, formed at a surface of said semiconductor substrate, said second conductivity type differing from said first conductivity type,
   an impurity diffusion layer of the second conductivity type formed at the surface of said first impurity diffusion region, and having an impurity concentration higher than the impurity concentration of said first impurity diffusion region, and
   a pair of electrodes provided apart from each other at a surface of said impurity diffusion layer, one of said electrodes being connected to said input terminal, and the other of said electrodes connected to a line of a first power supply potential;
   wherein said first impurity diffusion region is formed in a region located deeper than an element-separating insulating film that separates said semiconductor substrate and said terminating resistance element from each other.

* * * * *